US007045995B2

(12) United States Patent
Summers

(10) Patent No.: US 7,045,995 B2
(45) Date of Patent: May 16, 2006

(54) SYSTEM AND METHOD FOR CALIBRATING ELECTRONIC CIRCUITRY

(75) Inventor: James B. Summers, Spokane Valley, WA (US)

(73) Assignee: Agilent Technologies, Inc., Palo Alto, CA (US)

( * ) Notice: Subject to any disclaimer, the term of this patent is extended or adjusted under 35 U.S.C. 154(b) by 155 days.

(21) Appl. No.: 10/846,306

(22) Filed: May 14, 2004

(65) Prior Publication Data

US 2005/0253574 A1  Nov. 17, 2005

(51) Int. Cl.
 *G01R 27/00* (2006.01)
(52) U.S. Cl. .................. 324/158.1; 324/601
(58) Field of Classification Search ............ None
See application file for complete search history.

(56) References Cited

U.S. PATENT DOCUMENTS 6,463,266 B1 *  10/2002  Shohara ............... 455/196.1
2005/0118963 A1 *  6/2005  Chiu ..................... 455/115.1

* cited by examiner

*Primary Examiner*—Minh N. Tang

(57) ABSTRACT

In one embodiment, an algorithm is employed to calibrate electronic circuitry that is adjustable according to operating parameters. The calibration causes an output component to be substantially nulled. The algorithm includes adjusting at least one of the operating parameters over a plurality of values, applying an input signal to the electronic circuitry concurrently with the adjusting, measuring magnitudes of the output component from the electronic circuitry produced in response to the input signal and the adjusting, wherein the plurality of values are selected such that the magnitudes are not substantially nulled, and providing the magnitudes and the plurality of values to a curve fitting algorithm to calculate a plurality of operating parameters that cause the output component to be substantially nulled.

20 Claims, 2 Drawing Sheets

SYSTEM AND METHOD FOR CALIBRATING ELECTRONIC CIRCUITRY

TECHNICAL FIELD

The present invention is generally related to the calibration of electronic circuitry.

BACKGROUND OF THE INVENTION

A mixer is a device that is designed to receive two frequency signals and combines the signals to generate mixing products at frequencies that are the sum and difference of the received frequencies. In many cases, only one of the mixing products is desired. The other product is referred to as the "image." Image reject mixers are devices that ideally produce only the sum or difference product, but not both. The implementation of an image reject mixer involves two discrete mixers. The phase of the signals applied to the two mixers is controlled such that, when the two mixer outputs are combined, the desired products of the mixers add constructively and the image products add destructively. In the ideal case, the image is completely cancelled leaving only the desired product.

For image reject mixers, two factors contribute to the degree of image rejection. The first factor is the gain balance between the two discrete mixers within the device. Specifically, if one of the two discrete mixers generates products of greater magnitude than the other mixer, the image products of the two mixers will not completely cancel each other. The second factor is the phase relationship associated with the mixing. Specifically, if there is a phase error in the quadrature phase relationship between the signals driving the mixers, the image output products of the two mixers will not be exactly 180 degrees out of phase and hence will not completely cancel each other.

To achieve a relatively high degree of image rejection, the gain of the discrete mixers and the quadrature angle relationships in an image reject mixer can be calibrated. Typically, an iterative approach is applied in which the gain and the phase relationship are repetitively adjusted and the magnitude of the image is measured. Eventually, operating values defining the gain and phase relationship can be located that substantially null the image product. Additionally, a number of mathematical techniques can be employed to cause the operating values to converge more quickly. These techniques are generally related to "Newton's Method" of root finding in which the derivative of the image product magnitude versus the gain and phase are used to find the null.

BRIEF SUMMARY OF THE INVENTION

Representative embodiments are directed to systems and methods for calibrating electronic circuitry. In one representative embodiment, each operating parameter of the electronic circuitry is adjusted over a plurality of values. The signal component to be nulled is measured during the adjustment over the plurality of values. The selection occurs such that the signal component is not nulled during the measurement process for at least some of the plurality of values. The measurement values and the plurality of values used for the adjustment are provided to a curve fitting algorithm. The curve fitting algorithm is characterized by the response of the electronic equipment to the operating parameters. The curve fitting algorithm calculates optimal operating parameters for the electronic circuitry. By calibrating the electronic circuitry according to the calculated parameters, the signal component will be substantially nulled. Although one embodiment employs a curve fitting algorithm to calibrate an image reject mixer, any suitable electronic circuitry that operates according to a plurality of parameters can be calibrated by embodiments of the invention.

DETAILED DESCRIPTION OF THE INVENTION

Figure 1:
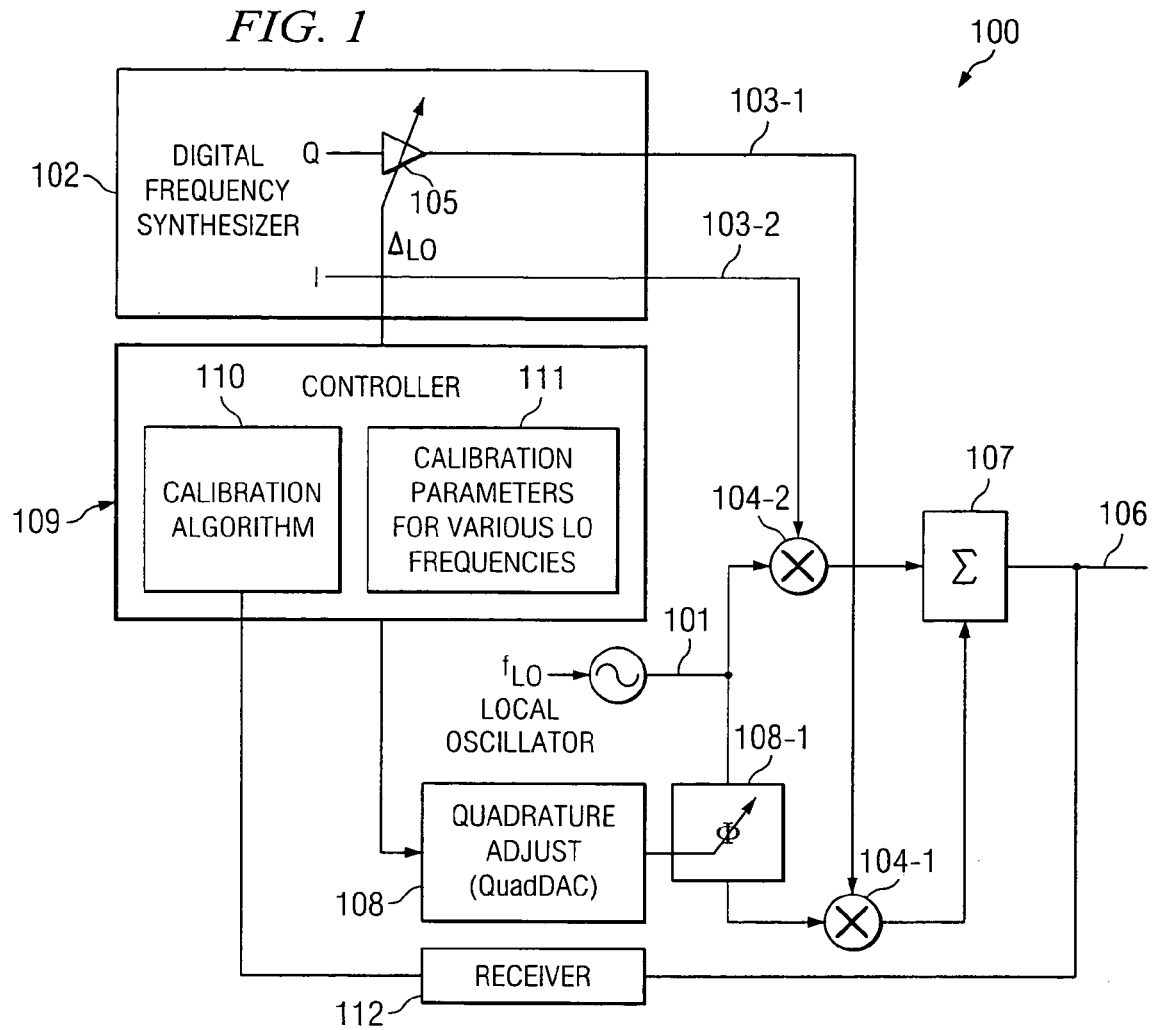
FIG. 1 depicts an image reject mixer with calibration functionality according to one representative embodiment.

To facilitate the discussion of one representative embodiment, reference is made to image reject mixer 100 of FIG. 1. The mixing functionality of image reject mixer 100 is typical of known mixer designs. However, image reject mixer 100 differs from known designs by employing controller 109 that calibrates mixer 100 according to one representative embodiment. Controller 109 may be implemented to perform calibration of mixer 100 using calibration algorithm 110 (e.g., suitable software instructions or integrated circuitry functionality).

Image reject mixer 100 receives local oscillator input signal 101 to be mixed with a digitally synthesized signal. Digital frequency synthesizer 102 digitally synthesizes this signal and converts the digital signal into analog form. Digital frequency synthesizer 102 outputs a first version of the signal via line 103-1 and a second version of the signal via line 103-2 (i.e., I and Q channels). The two versions of the signal are out of phase by 90°. The first version of the signal can be either amplified or attenuated by variable gain amplifier (VGA) 105. As shown in FIG. 1, although VGA 105 is implemented within the digital domain, an analog amplifier could be employed if desired. The gain of VGA 105 is represented by $\Delta_{LO}$. After VGA 105, the first version of the signal is mixed with the LO signal 101 by mixer 104-1. The second version of the signal is mixed with a 90° phase shifted version of the LO signal 101 by mixer 104-2. The mixed signals from mixers 104-1 and 104-2 are combined by adder 107 to produce image rejected mixer output 106. In the ideal case, the image products are equal in amplitude and 180° out of phase and, hence, add destructively. The desired products are in phase and hence add constructively.

In practice, several adjustments are typically needed. Specifically, the two versions of the LO signal may not be precisely 90° out of phase. QuadDAC 108 provides an analog signal which controls the phase shifter 108-1 in the LO signal path to mixer 104-1. This allows the phase relationship between the LO signals in the two mixers to be adjusted. Also, the gain associated with mixers 104-1 and 104-2 may be unequal. VGA 105 may be used to equalize the gain between mixers 104-1 and 104-2.

As previously discussed, known techniques iteratively vary the gain and phase relationship to converge to a precise calibration. The iterative approach is problematic. Specifically, because the iterative techniques cause the measurement of the image product to converge to a null, multiple measurements are made very close to the null. Accordingly, a requirement of a wide dynamic range is imposed by known techniques upon the measurement mechanism. Furthermore, noise may cause errors in the measurements and lengthen the amount of time to converge to the null. Moreover, if the dynamic range is not sufficiently wide, noise may prevent the algorithm from converging to the null.

In contrast to known techniques, controller 109 does not attempt to converge to a null in an iterative manner. Instead, controller 109 operates mixer 100 according to a plurality of values for the setting of QuadDAC 108 and the gain of VGA 105. Controller 109 measures the resulting signal characteristics (image product and desired product amplitudes) using receiver 112. Based upon the measurements, controller 109 employs a curve fitting algorithm to calculate appropriate phase and gain settings. Only a relatively few number of measurements are taken. Also, the measurements need not be made very close to the null. Accordingly, a wide dynamic range for the measurement mechanism is not required.

To apply a curve fitting algorithm to image reject mixer 100 as shown in FIG. 1, the relationship between the image product and the desired mixer product is defined as follows:

$$(\text{Image Product Magnitude})^2 = K_{RF}(1 + G^2 - 2G\cos(\Phi)), \quad \text{(Equation 1)}$$

$$(\text{Desired Product Magnitude})^2 = K_{RF}(1 + G^2 + 2G\cos(\Phi)), \quad \text{(Equation 2)}$$

where $K_{RF}$ is a gain constant, G is the gain imbalance (where zero imbalance is represented by G=1), and $\Phi$ is the phase error between the I and Q channels.

The values of G and $\Phi$ are determined in the calibration process. To compensate for gain imbalance, it is relatively straight forward to determine the proper hardware setting. Specifically, the gain of VGA 105 is set to the reciprocal of G. Compensation for the phase imbalance ($\Phi$) is more complicated. The phase imbalance can be modeled as:

$$\Phi = \Phi_{ERROR} + K_{QUAD} * \text{QuadDAC Setting},$$

where $\Phi_{ERROR}$ and $K_{QUAD}$ are unknown and LO frequency dependent. $K_{QUAD}$ is the sensitivity of the LO phase adjustment means 108-1. For perfect cancellation, $\Phi$ must be zero so:

$$\text{QuadDACSetting} = -\Phi_{ERROR}/K_{QUAD}.$$

$K_{QUAD}$ can vary for wide ranges of the QuadDAC setting. Accordingly, the measurements are made by limiting the range of variation in QuadDAC values to values "close" to the correct calibration value to avoid the complication presented by this variation. Measurements are made by setting the gain of VGA 105 and the QuadDAC setting to devitate around the correct calibration parameter. By taking the measurements in this manner, the measurements can be made away from the image product null, lowering the required dynamic range of the measurement mechanism. As a result, noise will have a lesser effect on the calibration process.

It is possible to dispense with $K_{RF}$ because it is common to both the desired product and the image product. Accordingly, the calibration process estimates three unknowns (G, $\Phi_{ERROR}$, and $K_{QUAD}$).

According to one representative embodiment, five measurements are made with different values of QuadDAC. A minimum squared error algorithm is used to determine the values of the unknowns that produce the minimum squared error as characterized by equations (1) and (2). The appropriate value for QuadDAC is determined from $K_{QUAD}$ and $\Phi_{ERROR}$. The gain imbalance (G) is not uniquely determined by only varying the QuadDAC setting. Either G or 1/G will be the correct value. Additional measurements using these two values can be made to resolve the ambiguity.

Due to measurement limitations associated with some receiver mechanisms, the gain value generated by the proceeding operations may not be as completely accurate as possible. A gain refinement algorithm may be employed after the proceeding operations to achieve a greater degree of accuracy if appropriate for a particular application. Specifically, the following "residual" gain error can be computed from the suppression generated by the proceeding operations: $g_{RESIDUAL} = 1 \pm \text{sqrt}(\text{image product magnitude/desired product magnitude})$. One of the values may be selected to further adjust the gain of VGA 105. If the selected value does not improve the image rejection, the other value is known to accurately represent the residual gain error.

In one embodiment, the calibration process is performed for a number of LO frequencies. The calibration parameters determined for the LO frequencies are stored in calibration parameters 111. When a user subsequently selects a LO frequency suitable for a particular application, controller 109 retrieves the corresponding calibration parameters and sets the hardware of mixer 100 accordingly. If calibration parameters are not found for a particular LO frequency, interpolated parameter values may be used.

Figure 2:
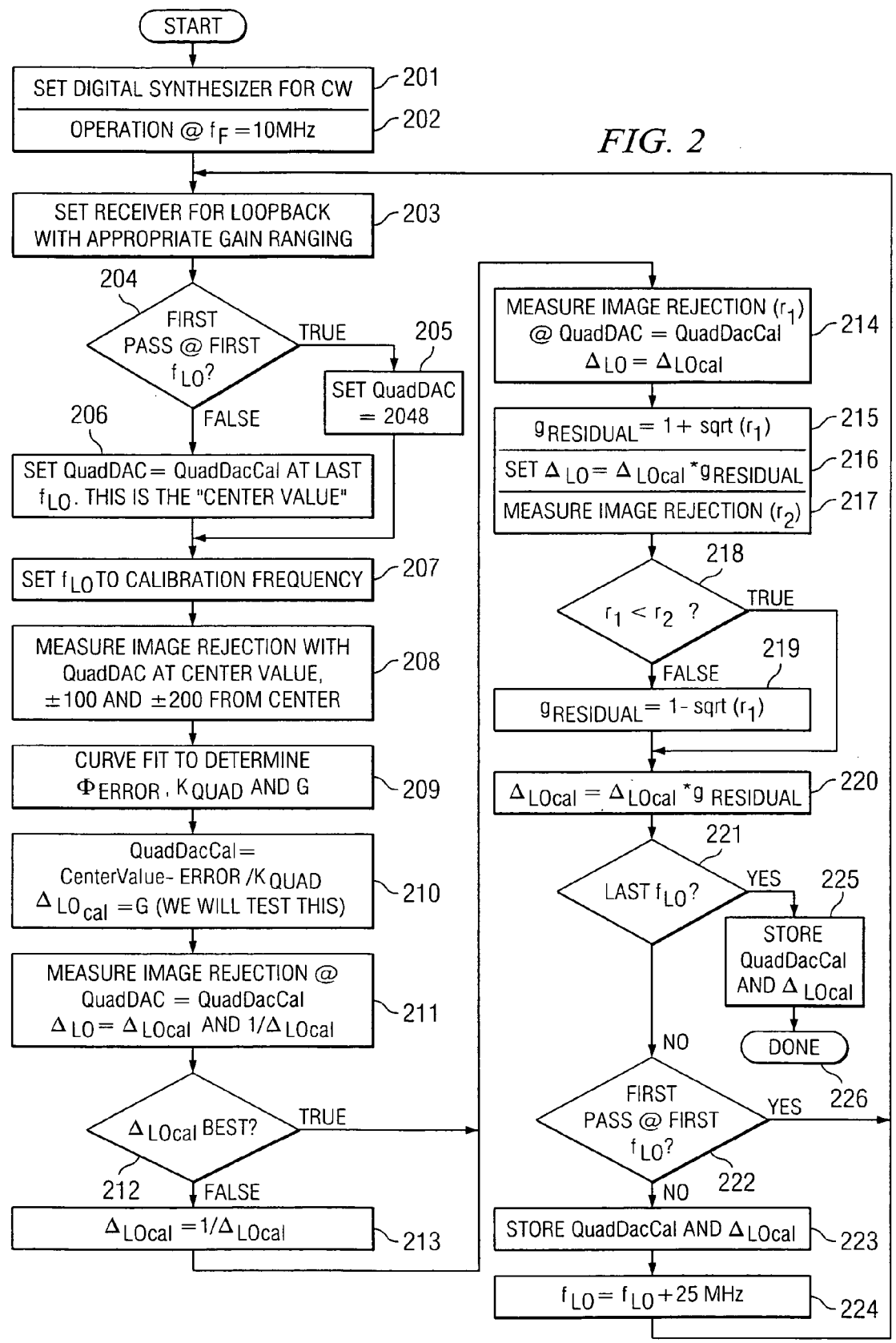
FIG. 2 depicts a flowchart for calibration of an image reject mixer according to one representative embodiment.

FIG. 2 depicts a flowchart for calibration of an image reject mixer across a plurality of LO frequencies according to one representative embodiment. The flowchart of FIG. 2 could be implemented as software instructions for controller 109 as an example.

In step 201, a digital synthesizer is set for continuous wave (CW) operation and the level of the synthesizer is set. In step 202, the IF frequency ($f_{IF}$) is set equal to 10 MHz. In step 203, the receiver is set for loopback operation and appropriate gain ranging so that it is measuring the output of the mixer.

As previously discussed, it is advantageous to cause the setting of the QuadDAC register to be "close" to the calibration value during the measurement process. Accordingly, each iteration of the flowchart uses the previously calculated calibration value as the "center" value for the next set of measurements. However, during the first iteration, a previous value of QuadDAC is not available. Multiple iterations are performed for the first $f_{LO}$ value to address the unavailability of a prior value of QuadDAC.

To provide the multiple iterations, a logical comparison is made (step 204) to determine whether the iteration of the process flow is the first pass at the first value of $f_{LO}$. If true, the process flow proceeds to step 205 where the value of QuadDAC is set to 2048 (its midrange value). This initial setting is dependent upon the particular hardware used to implement the digital to analog converstion signal which drives the phase adjustment. If the logical comparison of step 204 is false, the process flow proceeds to step 206 where the value of QuadDAC is set to the value of QuadDACCal associated with the previous iteration of the process flow. QuadDACCal is a variable that holds the value calculated by the curve fitting process for the correct hardware setting of QuadDAC.

In step 207, the LO frequency synthesizer 101 is set to achieve a LO signal frequency of $f_{LO}$. The variable $f_{LO}$, the local oscillator frequency, is set to an initial value. The variable $f_{LO}$ is stepped over a range of frequencies to cause the calibration process to be repeated to address the frequency-dependent nature of the image reject mixer. In step 208, multiple measurements of the image rejection are made by setting QuadDAC to the following values: the center value (see steps 205 and 206), the center value ±100, and the center value ±200. These settings of the phase adjustment parameters depend upon the implementation of the quadrature adjustment means. By varying the settings in this manner, a number of measurements will be made that are not substantially nulled. Accordingly, the calibration will be relatively robust against noise and does not require wide dynamic range.

In step 209, a curve fitting algorithm is performed to calculate $\Phi_{ERROR}$, $K_{QUAD}$, and G. For example, a minimum squared error algorithm may be applied to calculate the respective values. In step 210, the variable QuadDACCal is calculated from: the center value—$\Phi_{ERROR}/K_{QUAD}$. The variable $\Delta_{LOcal}$ is set to equal G.

In step 211, the image rejection values are measured in association with setting the register QuadDAC to equal QuadDACCal and the gain value $\Delta_{LO}$ to equal $\Delta_{LOcal}$ and $1/\Delta_{LOcal}$. In step 212, a logical comparison is made to determine whether $\Delta_{LOcal}$ produces a greater amount of image rejection than $1/\Delta_{LOcal}$. If not, the process flow proceeds to step 213 where the variable $\Delta_{LOcal}$ is set to equal the reciprocal. If so, the process proceeds to step 214.

In step 214, the image rejection ratio ($r_1$) is measured by setting QuadDAC to QuadDACCal and $\Delta_{LO}$ to $\Delta_{LOcal}$. In step 215, a gain residual variable ($g_{RESIDUAL}$) is set to equal $1+\text{sqrt}(r_{R1})$. In step 216, $\Delta_{LO}$ is set to equal $\Delta_{LOcal}*g_{RESIDUAL}$. In step 217, the resulting image rejection ratio ($r_2$) is measured.

In step 218, a logical comparison is made to determine which image rejection ratio ($r_1$ or $r_2$) is greater. If $r_{R1}$ is greater, the process flow proceeds to step 219. In step 219, the variable $g_{RESIDUAL}$ is set to equal $1-\text{sqrt}(r_1)$. In step 220, the variable $\Delta_{LOcal}$ is set to equal $\Delta_{LOcal}*g_{RESIDUAL}$.

In step 221, a logical comparison is made to determine whether the last frequency of the desired range of LO signal frequencies has been examined. If not, the process flow proceeds to step 222. If the last frequency has been examined, the parameters for the last iteration are stored (step 225) and the process ends (step 226).

In step 222, a logical comparison is made to determine whether the process flow is associated with the first past for the first value of $f_{LO}$. If so, the process flow returns to step 203 to perform another pass for the first value of $f_{LO}$ to further refine the value of QuadDACcal. If not, the process flow proceeds to step 223. In step 223, the values of QuadDACcal and $\Delta_{LOcal}$ are stored as the appropriate calibration parameters for the current value of $f_{LO}$. In step 224, the value of $f_{LO}$ is incremented by 25 MHz. From step 224, the process flow returns to step 203.

In an alternative embodiment, LO leakage may be addressed in a manner similar to the calibration described in FIG. 2. In general, some phase and amplitude components will leak through each mixer 104 in a frequency dependent manner. The LO leakage is especially pronounced when upconverting a relatively low frequency to a relatively high frequency. Specifically, the LO leakage will be close to the desired signal and hence difficult to filter. Adding DC offsets to the I and Q signals (following the variable gain on the Q channel) allows the LO leakage to be cancelled by providing an intentional leakage vector with amplitude equal to that of the mixer leakage component and with opposite phase. The appropriate values for the DC offsets can be calculated using multiple measurements and a curve fitting algorithm according to one representative embodiment.

Figure 3:
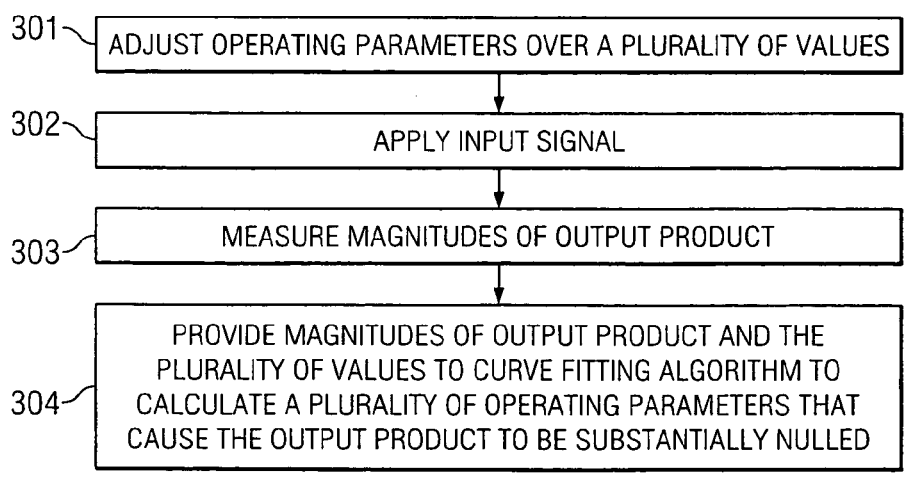
FIG. 3 depicts a flowchart for calibration of electronic circuitry according to one representative embodiment.

Although some embodiments have been described in terms of calibrating an image reject mixer, the present invention is not so limited. Other representative embodiments can be used to calibrate any suitable type of electronic circuitry where the mathematical relationship between the calibration adjustment parameters and circuit performance is known, but where coefficients in the relationship (such as gains and offsets) are not. For example, FIG. 3 depicts a flowchart for calibrating electronic circuitry that is adjustable using operating parameters according to one representative embodiment. The calibration is performed to null a signal or signal component (the "output product") generated by the electronic circuitry. The process flow of FIG. 3 may be implemented using a processor and suitable software instructions and/or using integrated circuit functionality.

In step 301 of FIG. 3, at least one of the operating parameters is adjusted over a plurality of values. The operating parameters are selected such that the output product is not substantially nulled during the measurement process for at least some of the operating parameters. In the present context, the term "not substantially nulled" means that the resulting signal characteristic or characteristics are sufficiently above the noise threshold to enable accurate measurement using the available measurement functionality. In step 302, an input signal is applied to the electronic circuitry in a concurrent manner with the adjustment of the operating parameters. In step 303, magnitudes of the output product from the electronic circuitry are measured that occur in response to the input signal and the plurality of operating parameters. In step 304, the magnitudes of the output product and the plurality of values are provided to a curve fitting algorithm. The curve fitting algorithm employs one or several equations that characterize the electronic circuitry being calibrated. The curve fitting algorithm calculates a plurality of operating parameters that cause the output product to be substantially nulled. The calculated operating parameters are used to calibrate various elements of the electronic circuitry to cause the output product to be substantially nulled during operation of the electronic circuitry.

By employing a curve fitting algorithm, some representative embodiments enable calibration of electronic circuitry to occur in a relatively efficient manner. Numerous iterations are not required to converge to "optimal" settings. Furthermore, some representative embodiments do not require a relatively large dynamic range on the measurement mechanism used to calibrate the electronic circuitry. Additionally, some representative embodiments perform the calibration process in a manner that is relatively robust to noise in the measurement data.

What is claimed is:

1. A method for calibrating electronic circuitry, that is adjustable according to operating parameters, to cause an output component to be substantially nulled, comprising:
   adjusting at least one of said operating parameters over a plurality of values;
   applying an input signal to said electronic circuitry concurrently with said adjusting;
   measuring magnitudes of said output component from said electronic circuitry produced in response to said input signal and said adjusting, wherein said plurality of values are selected such that at least some of said magnitudes are not substantially nulled; and
   providing said magnitudes and said plurality of values to a curve fitting algorithm to calculate a plurality of operating parameters that cause said output component to be substantially nulled, wherein said curve fitting algorithm is defined by at least one equation modeling a response of said electronic circuitry.

2. The method of claim 1 further comprising:
   varying a frequency of said input signal; and repeating said adjusting, applying, measuring, and providing in response to said varying.

3. The method of claim 2 further comprising:
storing calculated operating parameters for each frequency selected for said input signal.

4. The method of claim 1 wherein one of said operating parameters defines a gain value of a variable gain amplifier.

5. The method of claim 1 wherein one of said operating parameters defines a phase relationship between signals processed by said electronic circuitry.

6. The method of claim 1 wherein one of said operating parameters defines a direct-current (DC) offset.

7. The method of claim 1 wherein said electronic circuitry is an image reject mixer and said output component is an image component of said image reject mixer.

8. The method of claim 1 wherein said at least one equation modeling a response does not define sensitivities of said electronic circuitry in response to changes of said operating parameters.

9. The method of claim 8 wherein said curve fitting algorithm calculates said sensitivities of said electronic circuitry and calculates said plurality of operating parameters using said calculated sensitivities and errors determined from said magnitudes.

10. A system for calibrating electronic circuitry, that is adjustable according to operating parameters, to cause an output component to be substantially nulled, comprising:
means for varying an operating parameter;
means for causing application of an input signal to said electronic circuitry concurrently with operation of said means for varying;
means for obtaining measurements of said output component from said electronic circuitry produced in response to said input signal, wherein said means for varying does not cause said output component to be substantially nulled for some of said measurements; and
means for calculating a plurality of operating parameters that cause said output component to be substantially nulled using a curve fitting algorithm that processes said measurements and said varied operating parameter, wherein said curve fitting algorithm is characterized by at least one equation modeling a response of said electronic circuitry.

11. The system of claim 10 further comprising:
means for varying a frequency of said input signal.

12. The system of claim 11 further comprising:
means for storing calculated operating parameters for each frequency applied by said means for varying a frequency of said input signal.

13. The system of claim 10 wherein said operating parameter defines a gain of a variable gain amplifier.

14. The system of claim 10 wherein said operating parameter defines a phase relationship between signals processed by said electronic circuitry.

15. The system of claim 10 wherein said operating parameter defines a direct-current (DC) offset applied to a signal processed by said electronic circuitry.

16. An image reject mixer, comprising:
a first mixer for mixing an input signal and an I-channel;
a second mixer for mixing said input signal and a Q-channel;
a summer for mixing outputs from said first and second mixers;
a variable gain amplifier for amplifying one of said I-channel and said Q-channel;
a delay element for modifying a phase relationship between said I-channel and said Q-channel;
a controller for calibrating operation of said image reject mixer by: (i) varying operation of said delay element; (ii) obtaining signal measurements from said summer in coordination with said varying, wherein at least some measurements are not substantially nulled; (iii) applying said measurements to a curve fitting algorithm to calculate operating parameters for said variable gain amplifier and said delay element to substantially null an image product of said image reject mixer, wherein said curve fitting algorithm is characterized by a plurality of equations modeling a response of said image reject mixer.

17. The image reject mixer of claim 16 wherein said controller is operable to store calculated operating parameters for a plurality of frequencies of said input signal.

18. The image reject mixer of claim 16 wherein when a frequency is subsequently selected for operation of said image reject mixer that is not associated with stored operating parameters, said controller interpolates operating parameters using stored operating parameters adjacent to said selected frequency.

19. The image reject mixer of claim 16 further comprising:
a digital frequency synthesizer for generating said I-channel and said Q-channel.

20. The image reject mixer of claim 19 wherein said variable gain amplifier is implemented in a digital domain using said digital frequency synthesizer.

* * * * *